(12) United States Patent
Fuergut et al.

(10) Patent No.: US 11,715,719 B2
(45) Date of Patent: Aug. 1, 2023

(54) SEMICONDUCTOR PACKAGE AND METHOD OF FORMING A SEMICONDUCTOR PACKAGE

(71) Applicant: Infineon Technologies AG, Neubiberg (DE)

(72) Inventors: Edward Fuergut, Dasing (DE); Ralf Otremba, Kaufbeuren (DE); Irmgard Escher-Poeppel, Duggendorf (DE); Martin Gruber, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 463 days.

(21) Appl. No.: 16/875,531

(22) Filed: May 15, 2020

(65) Prior Publication Data

US 2020/0365548 A1    Nov. 19, 2020

(30) Foreign Application Priority Data

May 17, 2019   (DE) .......................... 102019113082.4

(51) Int. Cl.
*H01L 23/00*    (2006.01)
(52) U.S. Cl.
CPC .............. *H01L 24/45* (2013.01); *H01L 24/13* (2013.01); *H01L 24/43* (2013.01); *H01L 24/73* (2013.01)
(58) Field of Classification Search
CPC .......... H01L 24/45; H01L 24/13; H01L 24/43
See application file for complete search history.

(56) References Cited

U.S. PATENT DOCUMENTS

| 7,659,611 B2 | 2/2010 | Otremba |
| 7,880,280 B2 | 2/2011 | Otremba |
| 8,183,607 B2 | 5/2012 | Kajiwara et al. |

(Continued)

FOREIGN PATENT DOCUMENTS

| CN | 207542232 U | 6/2018 |
| DE | 3104960 A1 | 8/1982 |

(Continued)

OTHER PUBLICATIONS

Kakarla, Bhagyalakshmi, et al., "Short Circuit Ruggedness of New Generation 1.2 kV SiC MOSFETs", 2018 IEEE 6th Workshop on Wide Bandgap Power Devices and Applications (WiPDA), pp. 118-124.

*Primary Examiner* — Errol V Fernandes
(74) *Attorney, Agent, or Firm* — Murphy, Bilak & Homiller, PLLC

(57) ABSTRACT

A semiconductor package is provided. The semiconductor package may include at least one semiconductor chip including a contact pad configured to conduct a current, a conductor element, wherein the conductor element is arranged laterally overlapping the contact pad and with a distance to the contact pad, at least one electrically conductive spacer, a first adhesive system configured to electrically and mechanically connect the at least one electrically conductive spacer with the contact pad, and a second adhesive system configured to electrically and mechanically connect the at least one electrically conductive spacer with the conductor element, wherein the conductor element is electrically conductively connected to a clip or is at least part of a clip, and wherein the spacer is configured to electrically conductively connect the contact pad with the laterally overlapping portion of the conductor element.

23 Claims, 9 Drawing Sheets

(56) References Cited

U.S. PATENT DOCUMENTS

| | | |
|---|---|---|
| 2003/0038356 A1 | 2/2003 | Derderian |
| 2009/0212401 A1 | 8/2009 | Do et al. |
| 2010/0244213 A1* | 9/2010 | Nozaki .................. H01L 24/49 |
| | | 257/676 |
| 2015/0194373 A1 | 7/2015 | Otremba et al. |
| 2017/0271234 A1 | 9/2017 | Yen et al. |
| 2018/0122720 A1 | 5/2018 | Hable et al. |
| 2019/0080972 A1 | 3/2019 | Sato |

FOREIGN PATENT DOCUMENTS

| | | |
|---|---|---|
| DE | 102004042104 A1 | 3/2006 |
| DE | 102005054872 A1 | 5/2007 |
| DE | 102008006835 A1 | 9/2008 |

\* cited by examiner

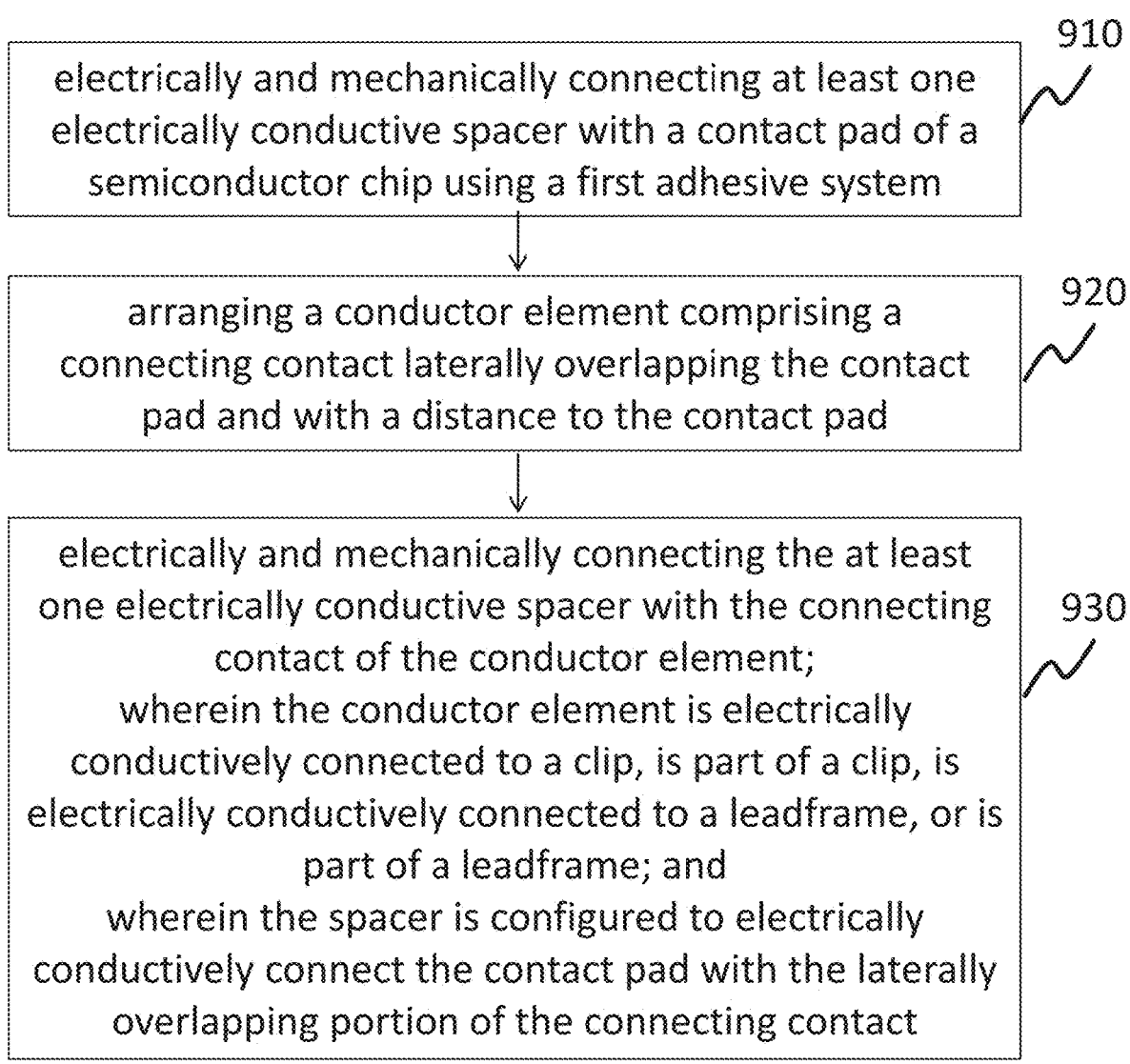

SEMICONDUCTOR PACKAGE AND METHOD OF FORMING A SEMICONDUCTOR PACKAGE

TECHNICAL FIELD

Various embodiments relate generally to a semiconductor package and to a method of forming a semiconductor package.

BACKGROUND

In power electronics, there is a persistent trend to provide more power using the same amount of (semiconductor) space, or even using less (semiconductor) space, because a densification has advantages in terms of cost (chip shrinkage) and performance (shorter ways for connecting devices, higher efficiency, lower losses, higher switching speed). Especially regarding silicon carbide (SiC) technology, chip shrinkage is a must to achieve a competitive cost-structure.

However, ever increasing shrinkage and densification of power devices causes a problem regarding the heat, which needs to be transported out of the component. SiC devices within transistor outline (TO) packages may have an effective bottom side cooling, especially if thick leadframes, e.g. with a thickness of about 2 mm, are used. Nevertheless, (reliability) short circuit tests have revealed that a surface temperature of the power electronics device may exceed a melting point for aluminum (Al), and that mold compound cracks may occur, because the heat transport may not be fast enough (e.g., it may require more than 2 μsec) (see e.g. "Short Circuit Ruggedness of New Generation 1.2 kV SiC MOSFETs", B. Kakarla et al., 2018 IEEE 6th Workshop on Wide Bandgap Power Devices and Applications (WiPDA)).

A double sided cooling (top- and bottom-side) may be able to solve this problem. While bottom side cooling is state of the art, the topside cooling underlies some challenges, which are caused by design rule limitations: For instance, up to 1000 μm edge termination may need to be provided due to electromagnetic fields. Furthermore, a 500 μm clearance around the source pad may be required for clip soldering. This may mean that the remaining source pad area for cooling may become very small for small (shrunk) chip sizes, and/or that a suitable clip may become quite expensive (e.g. spacer (Mo, AlSiCu etc.) solution for interconnect of the source/emitter may be used), and a thermomechanical stress may reach a limit (especially if a junction is heated up to a temperature Tj above 200° C.).

SUMMARY

A semiconductor package is provided. The semiconductor package may include at least one semiconductor chip including a contact pad configured to conduct a current, a conductor element, wherein the conductor element is arranged laterally overlapping the contact pad and with a distance to the contact pad, at least one electrically conductive spacer, a first adhesive system configured to electrically and mechanically connect the at least one electrically conductive spacer with the contact pad, and a second adhesive system configured to electrically and mechanically connect the at least one electrically conductive spacer with the conductor element, wherein the conductor element is electrically conductively connected to a clip, is at least part of a clip, is electrically conductively connected to a leadframe, or is part of a leadframe, and wherein the spacer is configured to electrically conductively connect the contact pad with the laterally overlapping portion of the conductor element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 9 shows a flow diagram of a method of forming a semiconductor package in accordance with various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

At present, in high power modules, which are relatively expensive devices anyhow, expensive spacers as described above may be a standard solution for improving a cooling of the module.

For SiCMOS, a wedge bonding of a wire onto a source pad may be a standard solution for improving a cooling of the module. Current designs may have one 125 µm wirebond on the source pad.

For semiconductor devices with smaller source pads, a diameter of the wire bond would have to be reduced. However, this may contradict the goal to remove increased hot spots.

Figure 1:
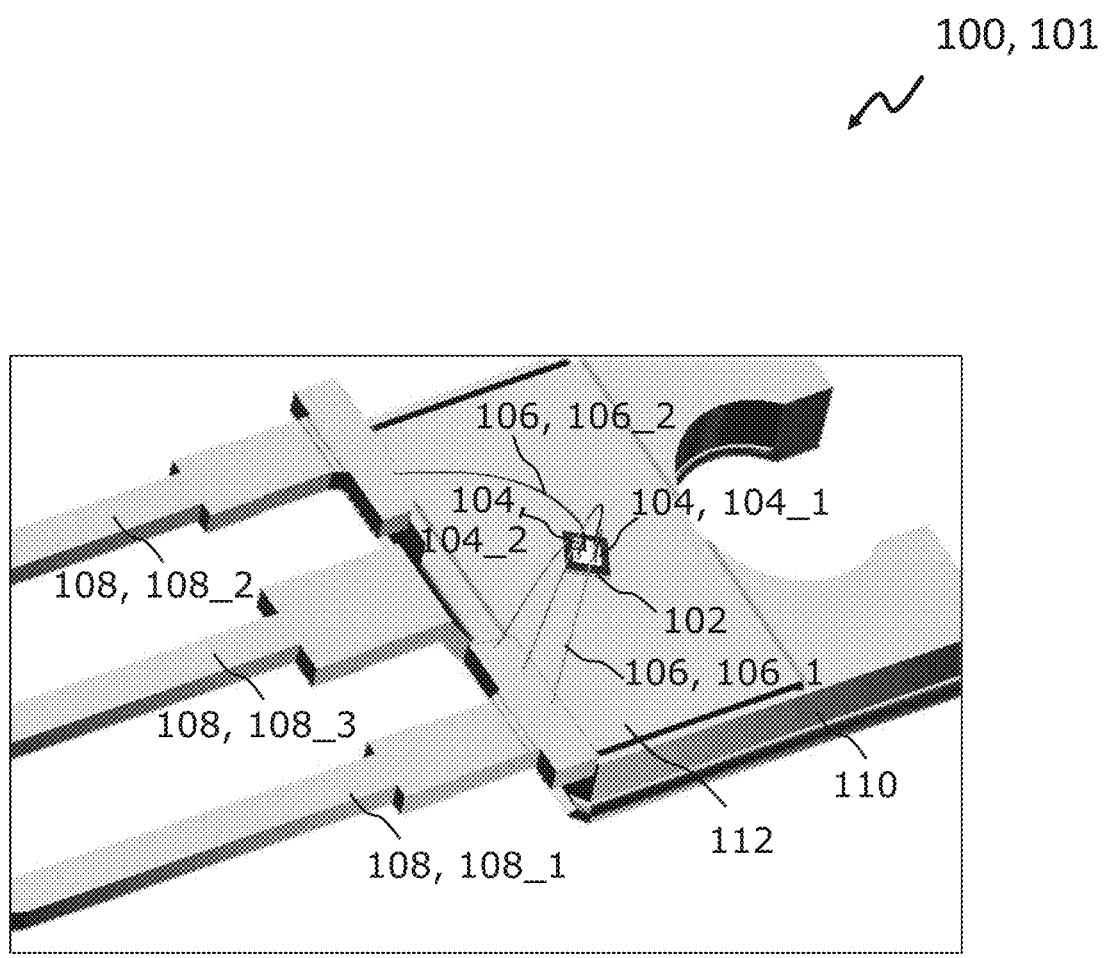
FIG. 1 shows a perspective view of an internal structure of a semiconductor package according to a state of the art.

FIG. 1 shows a perspective view of an internal structure 101 of a semiconductor package 100 according to a state of the art. The semiconductor package 100 includes a semiconductor chip 102 with contact pads 104. The contact pads 104 may include at least a control pad 104_2 and two controlled pads, of which only one (the source pad 104_1) is shown. FIG. 1 shows that the single wirebond could be replaced by a plurality of bonded wires 106, 106_1 (e.g., 3×65 µm copper (Cu) nailhead bonds, or 3×75 µm nailhead bonds). With this configuration, a smaller, e.g. triangular source pad 104_1 could be contacted and could carry similar or more current if a copper (Cu) material is used. At the device level, aluminum (Al) may be replaced by Cu.

However, the thinner wires 106, 106_1 may have a higher (e.g. thermal) resistance, such that, to compensate, the thin wires 104_1 would need shorter length (also indicated in FIG. 1 is a control wire 106_2 connecting the control pad 104_2 to an external contact 108_2, but since the control wire is not foreseen to carry large currents, heat transport may not be an issue there). But because of leadframe-geometry and specified high creeping distances for at least 1000 V components, distances between the chip and landing pads of the leads may be quite long, e.g. about 5 mm. In other words, it may be difficult or impossible to fulfill these quite different requirements: low resistivity and low inductance, and at the same time long creeping distances, high insulation and long distances between the chip surface and the transport of the electrical load to avoid crossing of electrical fields which occur near the chip edge.

If wedge bonding was used, with a shorter wire length and more lateral looping, this could lead to parasitic effects.

Furthermore, a Cu—Cu interconnect may require a higher bond force (e.g., as compared to aluminum), with a risk of causing a negative impact on the device. Also, the smaller bond diameters may mean that higher local bond forces are applied and that the contact area is smaller. But bigger diameters, as already laid out above, are limited by the source pad 104_2 dimensions.

In various embodiments, a semiconductor package is provided that may combine an electrically conductive spacer, through which a current may flow in a vertical direction between a chip contact and a top of the conductive spacer, with a conductor element configured to conduct the current from the top of the conductive spacer to an external contact.

In various embodiments, a plurality of thin, short vertically arranged wires (or, for example, thin metal columns) may be used as the electrically conductive spacer, and a metal element or clip with a larger cable cross-section (e.g. thicker and/or broader) may be used as the conductor element. Thereby, an advantage of a small area required for attaching the wires/columns may be combined with the advantage of good heat transport in the metal plate/clip.

In various embodiments, a single electrically conductive block may be used as the electrically conductive spacer, and a flat metal plate may be used as a first part of a multi-part conductor element, e.g. a clip. Thereby, a cost-efficient method of connecting a chip contact with an external contact may be provided. The metal plate, by being flat, may have such a general-purpose-shape that it may be suitable to be used in chip packages of different designs. For example, the flat metal plate may be used in various single- or multi-chip packages. In the multi-chip package, the flat metal plate may for example be used for connecting a plurality of chip contacts (each of which being part of a different chip) with a single external contact.

In various embodiments, the semiconductor package may include at least one semiconductor chip including a contact pad configured to conduct a current. The semiconductor package may further include a conductor element, wherein the conductor element is arranged laterally overlapping the contact pad and with a distance to the contact pad, at least one electrically conductive spacer, a first adhesive system configured to electrically and mechanically connect the at least one electrically conductive spacer with the contact pad, and a second adhesive system configured to electrically and mechanically connect the at least one electrically conductive spacer with the conductor element, wherein the conductor element is electrically conductively connected to a clip, is at least part of a clip, is electrically conductively connected to a leadframe, or is part of a leadframe, and wherein the spacer is configured to electrically conductively connect the contact pad with the laterally overlapping portion of the conductor element.

In various embodiments, the at least one electrically conductive spacer may be a plurality of ball bonds, and the conductor element may be a clip. In other words, a standard wire bonding (e.g., wedge bonding) between a contact (e.g. source) pad and a leadframe (or, more generally, substrate) may be replaced by short ball bonds that may be interconnected to a (low-inductive) clip. The short length of the (e.g. source) wire bonds may be only about e.g. 20% of the length of the standard wire bonds (e.g., 1 mm instead of 5 mm), and therefore a related resistance reduction and a faster heat transfer may be achieved. The low-inductive clip may have a large cable cross section (e.g., from about 200 µm$^2$ up to about 4000 µm$^2$).

In various embodiments, for example using a configuration as described hereabove or a similar one, nearly no parasitic capacitances may be formed, such that a high switching performance may be made possible.

In various embodiments, for example using a configuration as described hereabove or a similar one, a capability for exposed pads (e.g., the clip may be exposed) may be provided, which may enable a fast heat-transfer.

In various embodiments, for example using a configuration as described hereabove or a similar one, various connections, e.g. an emitter-, a gate-, and/or a sense-interconnect may be provided using a one-process-technology.

In various embodiments, a capability for a gate-area-shrink on chip may be provided, for example from a current size of approximately 400 µm×400 µm down to a size of approximately 100 µm×100 µm, which may have a direct impact on chip size (e.g., a SiCMOS with a size of about 1 mm$^2$ may have more than 10% shrink potential).

In various embodiments, a semiconductor package with a good manufacturability at reasonable costs may be provided, since additional costs for (slightly) more expensive processes during back-end processing may be balanced by cost savings brought about by a decreased chip area.

In various embodiments, the at least one electrically conductive spacer may be a single electrically conductive block, and the conductor element may be a flat clip. The semiconductor package, e.g. the power package, may in various embodiments be a multi-chip-module, and the clip may be a multi-chip-clip. In other words, contact pads of different chips that are supposed to be electrically connected to a common external contact may be contacted by a single flat clip. The electrically conductive block may have a thickness that may allow the flat clip to be arranged in contact with the electrically conductive block and essentially parallel to a surface of the contact pad without coming into contact with further contact pads on the chip, e.g. in an edge region of the chip. In other words, any shorting of the further contact pads with the clip that may be mounted during backend processing, may be avoided. The electrically conductive block, which may for example be a copper block, may in various embodiments be mounted at wafer level.

A complex and/or expensive clip design may be made obsolete by the above described flat clip (in combination with the metal block). It may even be possible to use the same flat clip in different packages.

Thus, in various embodiments, cost savings regarding the clip bonding may be made possible.

Figure 3A:
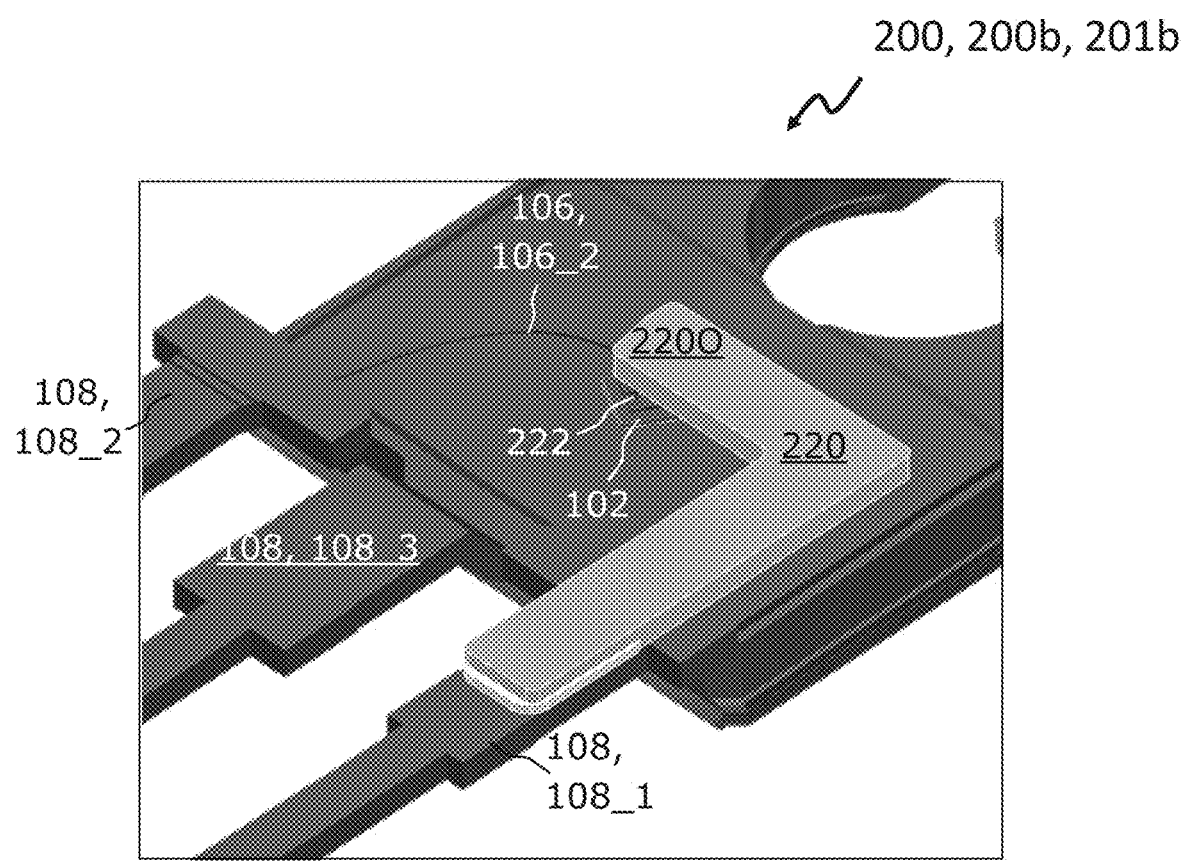
FIG. 3A shows a perspective zoomed-in view of an internal structure of a semiconductor package in accordance with various embodiments.
Figure 3B:
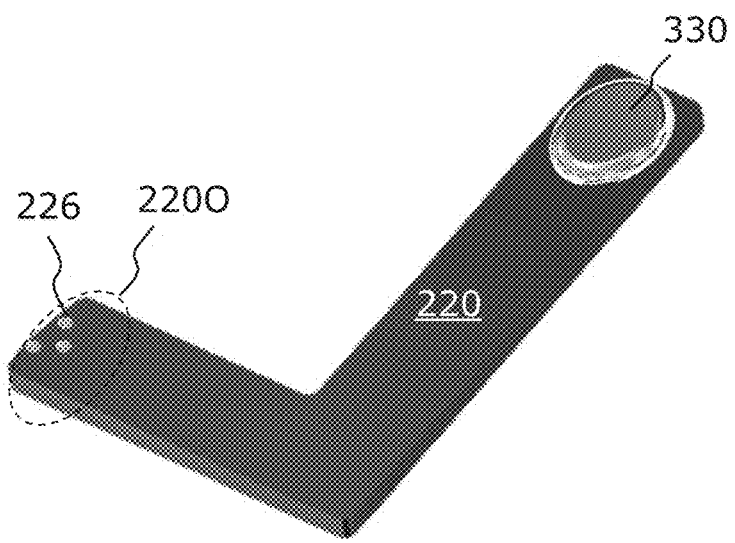
FIG. 3B shows a detailed schematic view of a conductor element used in the semiconductor package of FIG. 3A.
Figure 4:
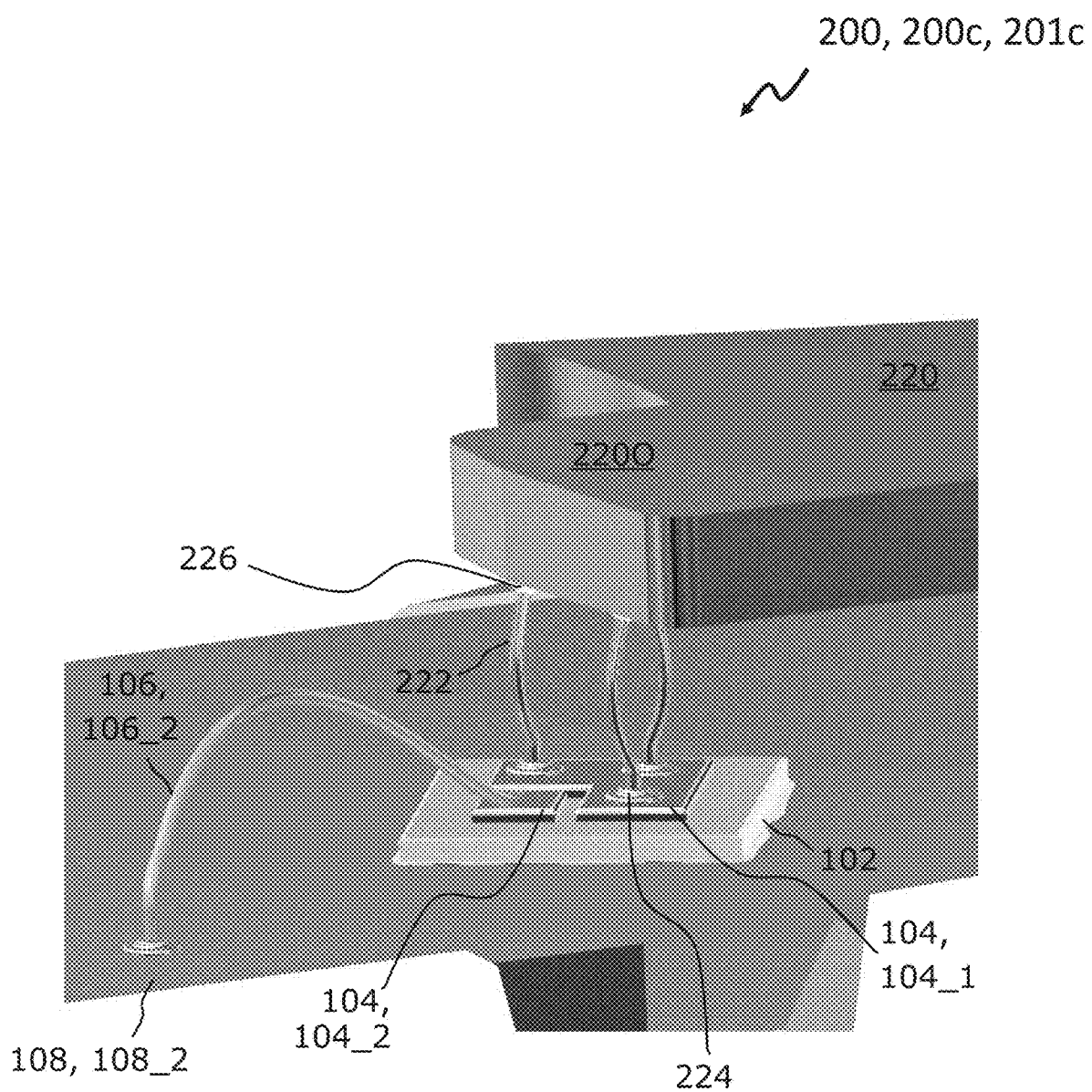
FIG. 4 shows a perspective zoomed-in view of an internal structure of a semiconductor package in accordance with various embodiments.
Figure 5A:
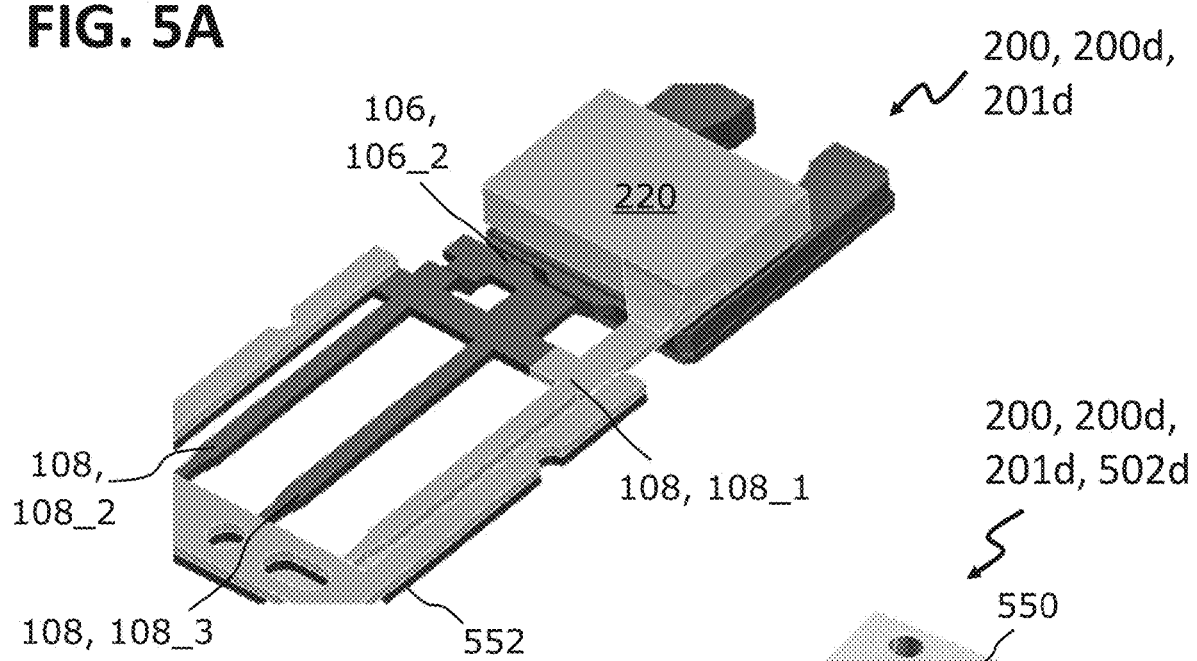
FIG. 5A shows a perspective view of an internal structure of a semiconductor package in accordance with various embodiments.
Figure 5B:
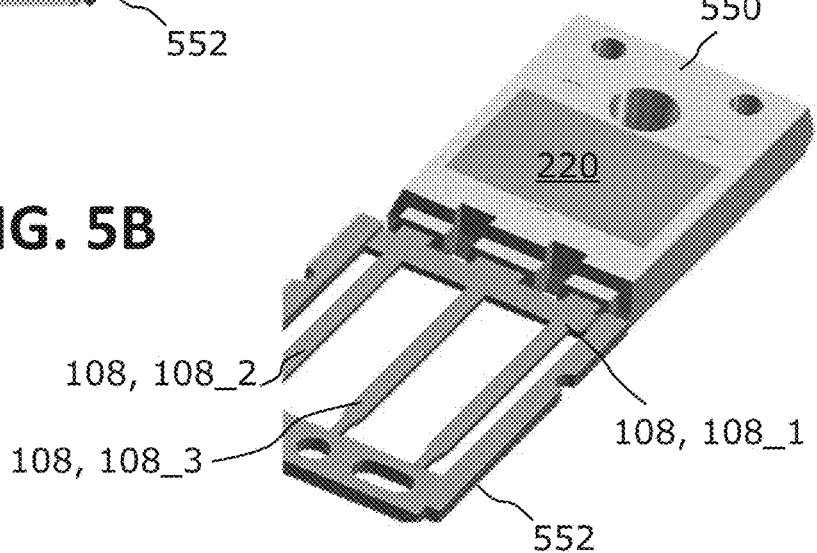
FIG. 5B shows a perspective view of the internal structure of a semiconductor package of FIG. 5A with an encapsulation.
Figure 5C:
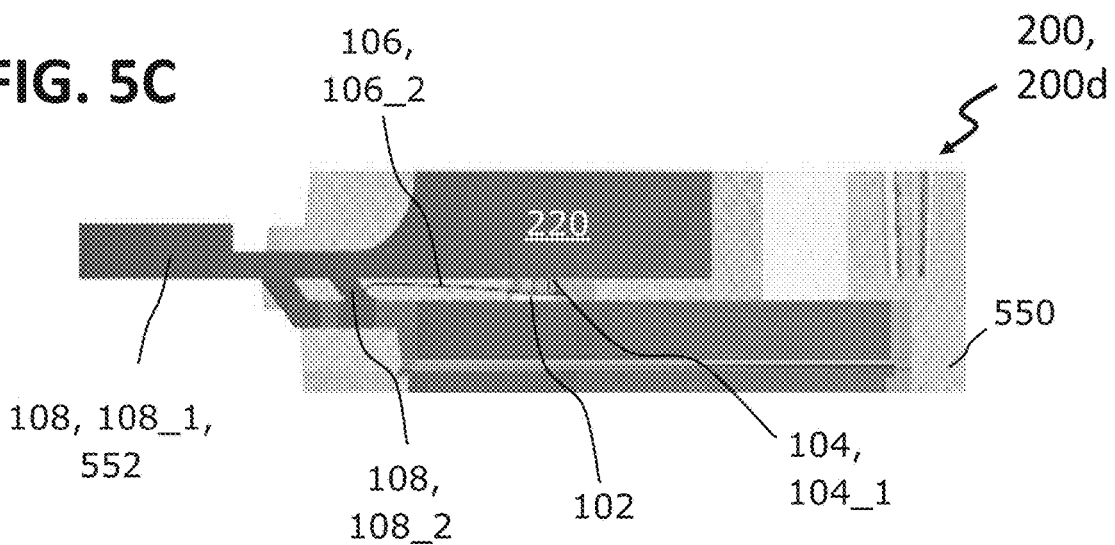
FIG. 5C shows a schematic side view of a package based on the encapsulated internal structure of FIG. 5B in accordance with various embodiments.
Figure 7:
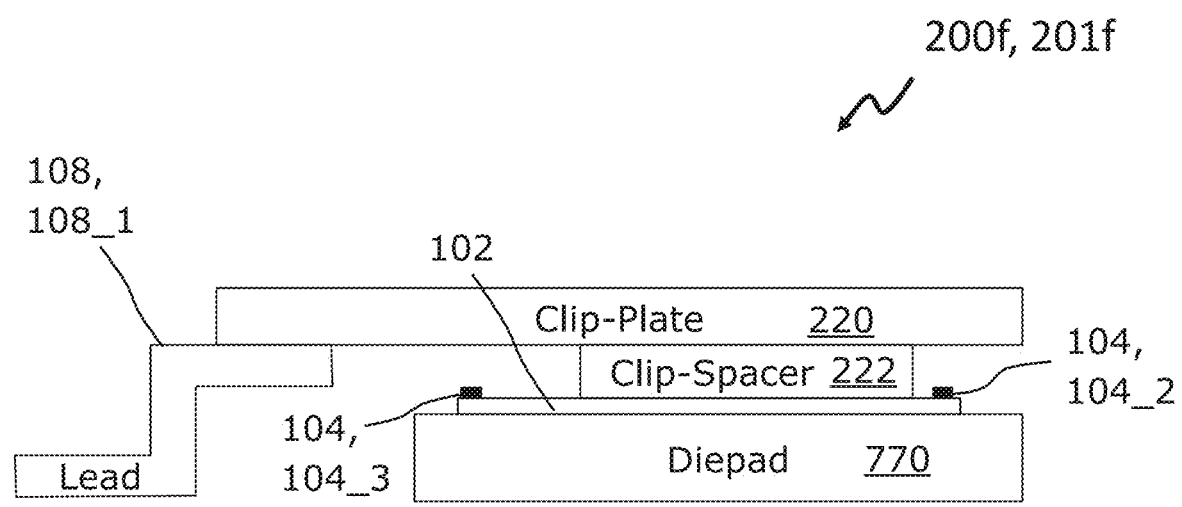
FIG. 7 shows a cross-sectional schematic view of an internal structure of a semiconductor package in accordance with various embodiments.

Each of FIG. 2, FIG. 3A, FIG. 4, and FIG. 5A each shows a perspective zoomed-in view of an internal structure 201 of a semiconductor package 200 in accordance with various embodiments. For easy reference, different internal structures 201 and respective semiconductor packages are differentiated by appended letters (i.e., internal structures 201a, 201b etc. and semiconductor packages 200a, 200b, etc., respectively). FIG. 5A shows a perspective view of an internal structure 201d of a semiconductor package. FIG. 5B shows the internal structure 201d with an encapsulation 550, FIG. 5C shows a schematic side view of a semiconductor package 200d based on the encapsulated internal structure 502d of FIG. 5B, and FIG. 7 shows a cross-sectional schematic view of an internal structure 201f of a semiconductor package 200f, each in accordance with various embodiments. FIG. 3B shows a detailed schematic view of a conductor element 220 used in the semiconductor package 200b of FIG. 3A.

As shown for example in FIG. 2, FIG. 3A, FIG. 4, FIG. 5C, FIG. 6 and FIG. 7, the semiconductor package 200 may include a semiconductor chip 102, also simply referred to as "chip". The semiconductor chip 102 may form or include a semiconductor device, e.g. a power device, for example a diode, a transistor (e.g. IGBT, MOSFET), or the like. A semiconductor material of the semiconductor chip 102 may be any semiconductor material typically used for semiconductor devices, for example silicon carbide (SiC), silicon (Si), or gallium nitride (GaN). In various embodiments, more than one semiconductor chip 102 may be provided in the semiconductor package 200 (not shown).

The semiconductor chip 102 may include a contact pad 104, 104_1 configured to conduct a current. The semiconductor chip 102 may in various embodiments include at least one further contact pad 104. In the figures, a further contact pad that is also configured to conduct the current (i.e., vertically through the chip 102) is not visible, because it is located at a side of the chip 102 that is opposite to the contact pad 104, 104_1. The side of the chip 102 with the contact pad 104, 104_1 may be referred to as front side, and the opposite side as back side of the chip 102. In various embodiments, a yet further contact pad 104, 104_3, for example configured to control the current, may additionally be arranged on the front side of the chip 102. In various embodiments, one or more yet further contact pads may be provided, for example for a temperature measurement or a sensing of a current.

In various embodiments, the semiconductor package 200 may include a conductor element 220. A portion of the conductor element 220 that may be configured to form a mechanical and electrical contact to an electrically conductive spacer 222 (described below) may be referred to as a connecting contact.

The conductor element 220 may be arranged laterally overlapping the contact pad 104_1 and with a distance to the contact pad 104_1. The distance between the contact pad 104_1 and the laterally overlapping portion 2200 of the conductor element 220 may be larger than 100 µm and smaller than about 5 mm. In an embodiment in which the semiconductor package 200 includes more than one chip 102, and in which the conductor element 220 is configured to be connected to each of the contact pads 104_1 of the respective chips 102, the conductor element 220 may be arranged laterally overlapping each of the contact pads 104_1 and with a distance to each of the contact pads 104_1.

The conductor element 220 may in various embodiments be configured to form part of an electrically conductive connection between the contact pad 1041 of the chip 102 and an external contact 108_1 (wherein external means that the contact will be accessible from outside an encapsulation 550 of the semiconductor package 200, see FIG. 5B and FIG. 5C). In various embodiments, the external contact 108_1 may be contacted with a clip, and the conductor element 220 may be part of the clip or may be electrically conductively connected to the clip. In various embodiments, the external contact 108_1 may be part of a leadframe, and the conductor element 220 may be electrically conductively connected to the leadframe, or it may be part of the leadframe.

In various embodiments, the semiconductor package 200, 200a may include at least one electrically conductive spacer 222, which may also be referred to as spacer 222. It is to be understood that, even if only the singular form is used, one or more than one spacer 222 may be used, unless the opposite is explicitly mentioned or clear from the context. The spacer 222 may form a further part of the electrically conductive connection between the contact pad 104_1 of the chip 102 and the external contact 108_1. In the embodiment shown in FIG. 2, the semiconductor package 200, 200a includes three electrically conductive spacers 222, i.e. three wires used as spacers 222.

The spacer 222 may include or consist of at least one metal, for example copper, aluminum, gold, silver, nickel, iron, palladium, or a mixture or composite thereof, e.g. a copper-diamond-composite, a silver-diamond composite, a copper-graphite-composite or the like, or for example an alloy, e.g. a copper alloy, or a multi-layer structure, e.g. copper, nickel or iron plated with silver, gold and/or palladium.

Figure 2:
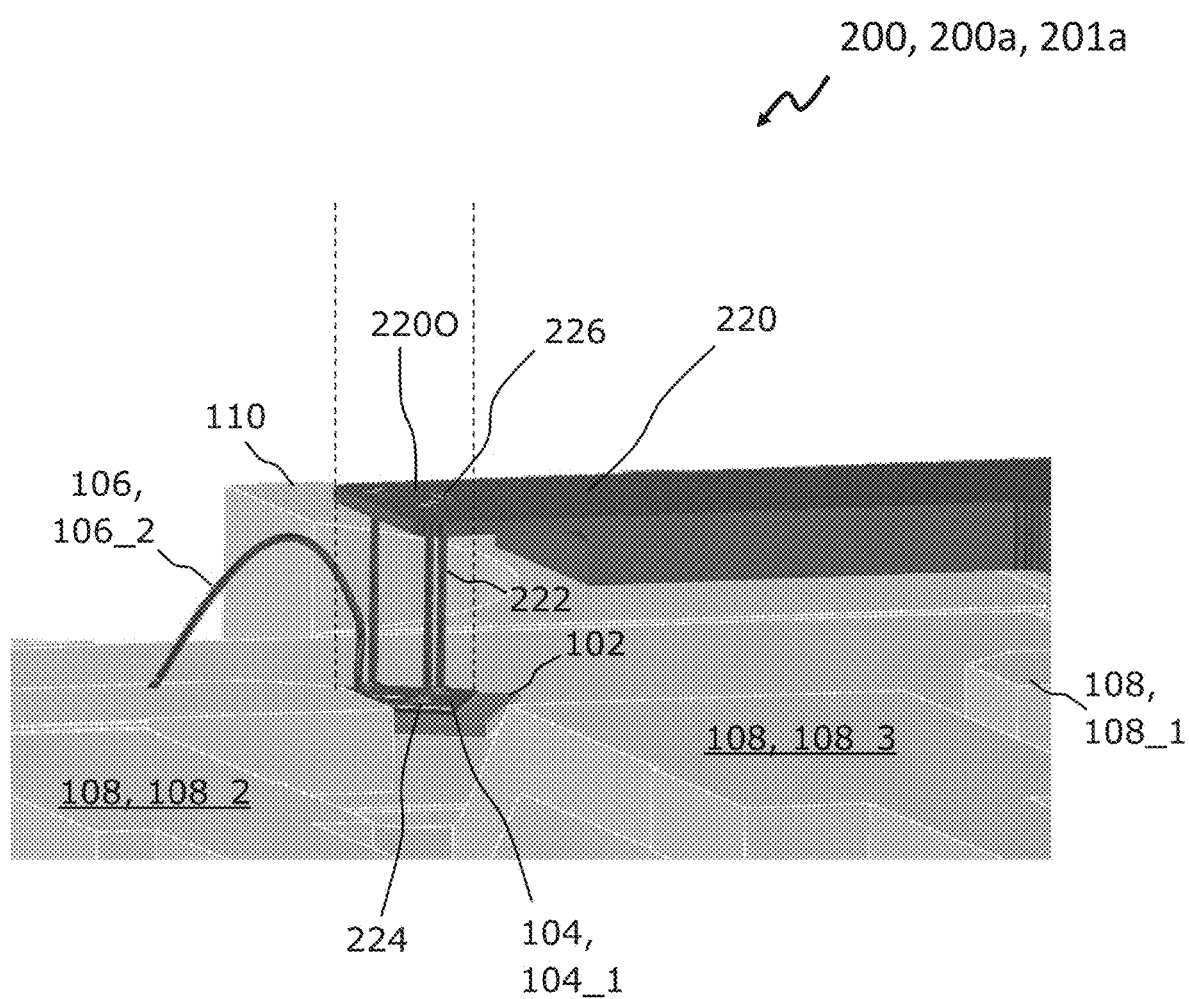
FIG. 2 shows a perspective zoomed-in view of an internal structure of a semiconductor package in accordance with various embodiments.

In various embodiments, as shown for example in FIG. 2 and in FIG. 4, the spacer 222 may consist of one or more wires, for example copper wire(s) 222, which may be coated or uncoated. A thickness of the wires may be in a range from about 20 µm to 600 µm, for example between 50 µm and 100 µm, for example around 65 µm or around 75 µm.

In various embodiments, electrically conductive columns 222 may be used (not shown). The columns 222 may for example be copper columns, for example with a nickel coating, and/or a solder coating (e.g. a tin based solder, e.g. an SAC solder). Each cylinder may for example have a length that is a factor of 1.5 to 2.5 of its diameter. The diameter may be in a range from about 60 µm to about 350 µm.

Figure 8:
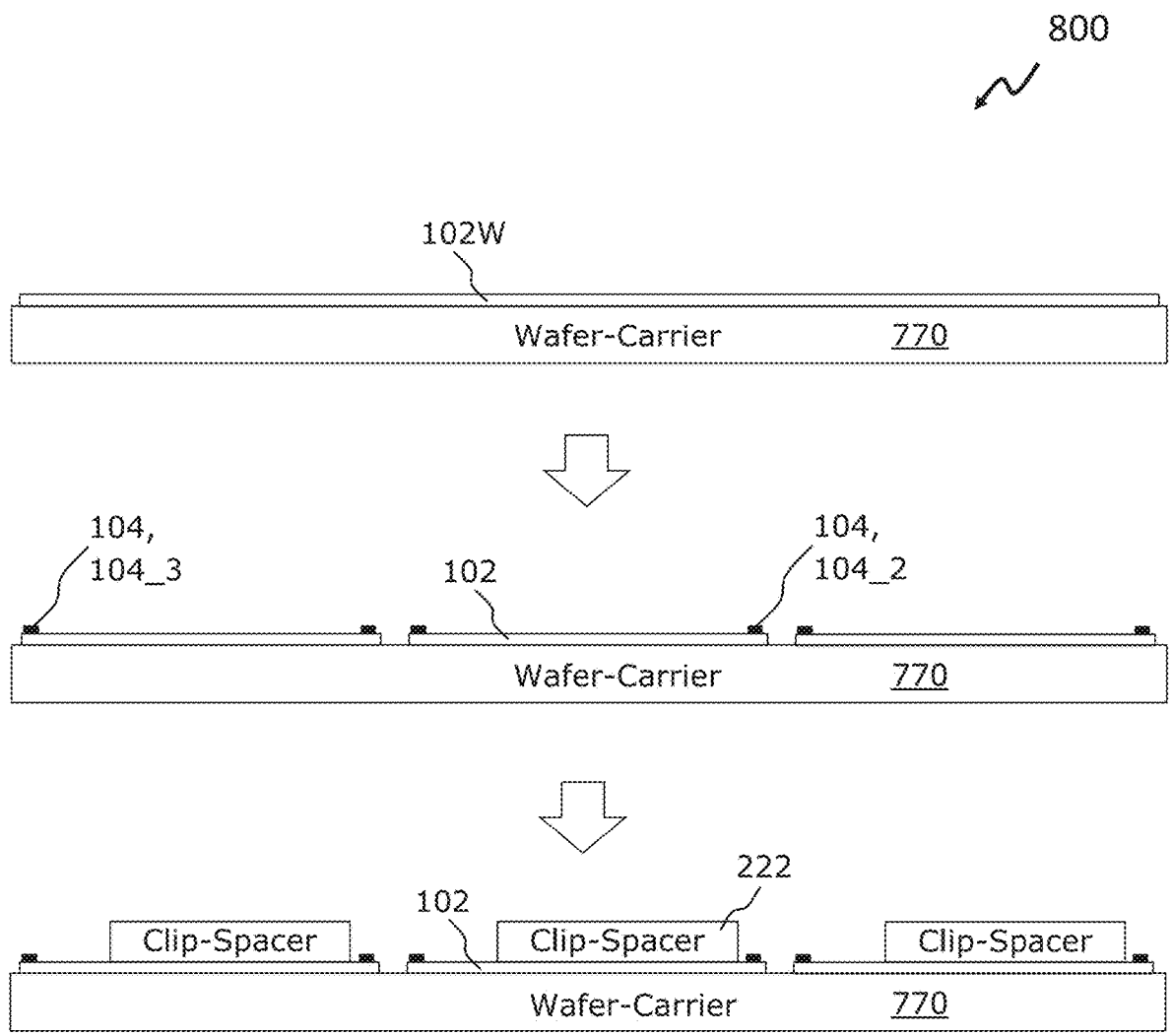
FIG. 8 visualizes, in three schematic cross-sectional views, aspects of a method of forming a semiconductor package in accordance with various embodiments.

In various embodiments, as for example shown in FIG. 7 and in FIG. 8, a single electrically conductive block 222 may be used. The block 222 may for example be rectangular. It may have a length in a range from about 60 µm to about 1000 µm, for example between 300 µm and 700 µm.

In various embodiments, for example in a case of using the single electrically conductive block 222, e.g. a metal block, the spacer 222 may be connected to the contact pad 104_1 on wafer level. A corresponding process 800 is visualized in FIG. 8, in which three schematic cross-sectional views show aspects of a method of forming a semiconductor package in accordance with various embodiments.

Firstly, as shown in the top panel, a semiconductor wafer 102W may be arranged on a wafer carrier 770. Thereafter, as shown in the middle panel, the semiconductor wafer 102W may be singulated into a plurality of semiconductor chips 102. Furthermore, electrically conductive structures may be formed on a top surface of the chips 102 near respective edges of the chips 102, and may therefore also be referred to as chip edge structures. They may be a second contact pad 104_2 and a third contact pad 104_3 of the chip 102, or any other electrically conductive chip structure that is not supposed to come into direct contact with the spacer 222, the first contact pad 104_1 (not shown in FIG. 8) and/or the first external contact 108_1 (also not shown in FIG. 8, but see FIG. 7).

As shown in FIG. 8 in the bottom panel, the spacer 222 may be connected to the semiconductor chip 102 (to its first contact pad 104_1, which is not shown) with a first adhesion system (not shown). The spacer 222 may for example be glued, soldered, sintered or welded onto the semiconductor chip 102. A thickness of the spacer 222 may be such that a flat clip as the conductor element 220 (see FIG. 7), which may be connected to the spacer 222 using a second adhesive system (not shown), may connect the spacer 222 to an external contact 108_1 without coming in contact with the chip edge structure 104.

In various embodiments, also the single-block spacer 222 may be mounted during backend processing, e.g. before mounting the conductor element 220 (e.g. the clip).

The single-block spacer 222 may have comparatively relaxed positioning tolerances and, due to a large connection area, a high conductivity.

As a consequence, a cost/performance ratio will be increased in the package 200. The clip-spacer 222 on wafer level may significantly reduce a complexity of the clip design down to a clip plate, thereby minimizing costs.

The plurality of thin (e.g. wire or column) spacers 222 may allow for arranging an encapsulation material 550 not only around, but also in between the spacers 222. Thereby, an average thermal coefficient of expansion may be better matched between the different materials.

As shown in FIG. 2 and in FIG. 4, in which the spacer 222 is provided as a plurality of wires, the wires 222 may be ball bonded (also referred to as nailhead bonded or stud bump bonded) to the contact pad 104_1. This may allow to attach a plurality of closely spaced wires 222 to the small area of the contact pad 104_1. The ball bond, or an alternative system configured to electrically and mechanically connect the spacer 222 to the contact pad 104_1, may form a first adhesive system 224. Alternative methods of connecting the spacer 222 to the contact pad 104_1 may include soldering (e.g. reflow soldering), gluing, sintering, or welding, e.g. laser welding. In other words, the first adhesive system 224 may for example include or consist of a ball bond, a solder, a glue, a sinter zone or a weld zone.

After the electrically and mechanically connecting the spacer 222 to the contact pad 104_1 (e.g., the ball bonding), the spacer (e.g. wire) 222 may extend essentially vertically from a surface of the contact pad 104_1.

In various embodiments, as shown for example in FIG. 2 and FIG. 4, a second adhesive system 226 configured to electrically and mechanically connect the at least one electrically conductive spacer 222 with the conductor element 220 (e.g., its connecting contact) may be arranged between the spacer 222 and the conductor element 220. The second adhesive system 226 may for example include or consist of a ball bond, a solder, a glue, a sinter zone or a weld zone, and may correspondingly be formed for example by ball bonding, soldering, gluing, sintering or welding, e.g. laser welding. In various embodiments, the arranging of the second adhesive system 226 may include or consist of a press contact, e.g. a pressfit contact.

The first adhesive system 224 and the second adhesive system 226 may be combined in any way that is technically possible. While it may be technically impossible to have ball bonds as both, the first adhesive system 224 and the second adhesive system 226, for the other types of the first adhesive system 224 and the second adhesive system 226, both may be the same, e.g. both glue, both solder, both sinter zones or both weld zones. In various embodiments, the first adhesive system 224 of a first type, e.g. ball bond, may be combined with the second adhesive system 226 of a second type, e.g. glue, solder, sinter zone or weld zone (and the corresponding connecting method, respectively). Similarly, the second adhesive system 226 of a first type, e.g. ball bond, may be combined with the first adhesive system 224 of a second type, e.g. glue, solder, sinter zone or weld zone (and the corresponding connecting method, respectively). Similarly, other combinations may be provided, e.g. glue/solder, solder/weld, etc., or vice versa, for the first adhesive system 224 and the second adhesive system 226, respectively, or for example a combination of any of the types of the first adhesive system 224 with the pressfit contact as the second adhesive system 226, e.g. a glue/pressfit combination or a solder/pressfit combination.

Using the ball bond and/or the weld as the first adhesive system 224 and/or as the second adhesive system 226, respectively, may mean that only a material of one or both of the connection partners (the spacer 222 for the first adhesive system 224, the spacer 222 and/or the conductor element 220 for the second adhesive system 226, respectively) may be used for forming the connection. As a consequence, effects arising from a material mix of a solder connection and/or an organic contamination that may be brought about by, e.g., a glue, may be avoided.

On the other hand, using an additional material (e.g., solder, glue, sinter paste) as the first adhesive system 224 and/or as the second adhesive system 226 may relax constraints on a placement accuracy.

In various embodiments, as shown as examples in FIG. 2, FIG. 3A and FIG. 4, after a ball bonding of the spacers 222 to the contact pad 104_1, the conductor element 220 may be arranged with its overlapping portion 2200 overlapping the contact pad 104_1 and may be connected to the spacer(s) 222.

The conductor element 220, as shown in FIG. 2 (in which the conductor element 220 is a clip) may be provided with through-holes. A number and configuration of the through-holes may correspond to the number and configuration of the spacers 222 that may extend essentially vertically from the contact pad 104_1. The through-holes may provide a guiding function that may allow for an easy positioning of the spacers 222 relative to the conductor element 220, because the spacers 222 may easily be threaded into the through-holes (which may optionally be funnel-shaped at the bottom side). The second adhesive system 226, e.g. a glue, solder, weld (e.g. using a laser) or the like, may be provided from a top side, which may be easily accessible.

As shown in FIG. 3B, the conductor element 220 (in this case, a clip) may be provided with embossed landing pads that may be filled with a solder, a sinter paste or a glue. A placement accuracy of the conductor element 220 (the clip) may thus be comparatively relaxed. The clip may be soldered, sintered or glued to the first external contact 1081 using a third adhesive system 330 the first external contact 108_1 may be part of a lead frame. As an alternative, the conductor element 220 and the first external contact 108_1 may be integrally formed, for example in a case of the conductor element 220 being part of a lead frame. Such an embodiment using a clip-leadframe is shown in FIG. 5A, FIG. 5B and FIG. 5C. The clip-leadframe is provided as a dual-gage clip-leadframe in which the conductor element 220 (the clip) provides a massive top-side heat sink for the semiconductor package 200, 200d. As shown in FIG. 5B and FIG. 5C, the clip 220 may be exposed (on its backside, which is facing away from the chip 102) for thermal dissipation. Such a package may be referred to as Double Sided Cooled Package. Alternatively, the clip 220 may be completely embedded, a corresponding package referred to as Fully Isolated Package.

In various embodiments, as for example shown in FIG. 4, the spacer 222 may be spring-loaded. In other words, the spacers 222 may be longer than a distance between a surface of the contact pad 104_1 and a bottom surface of the conductor element 220, such that, during a connecting the spacers 222 with the conductor element 220, the spacers 222 bend. Thereby, a connection with a higher robustness against a pressure from an encapsulation material 550 (see FIG. 5B and FIG. 5C) may be provided. This may lead to a more reliable electrical connection between the spacers 222 and the conductor element 220. A double-sided cooling may be provided using a standard transfer-molding process. As a result of the spacer 222 being spring-loaded, a thickness of the package 200 may be reduced as compared to the package 200 without the spring-loading by a compression applied by the mold tool. The reduction in package thickness may for example be in a range from about 10 µm to about 30 µm, e.g. about 20 µm.

Figure 6A:
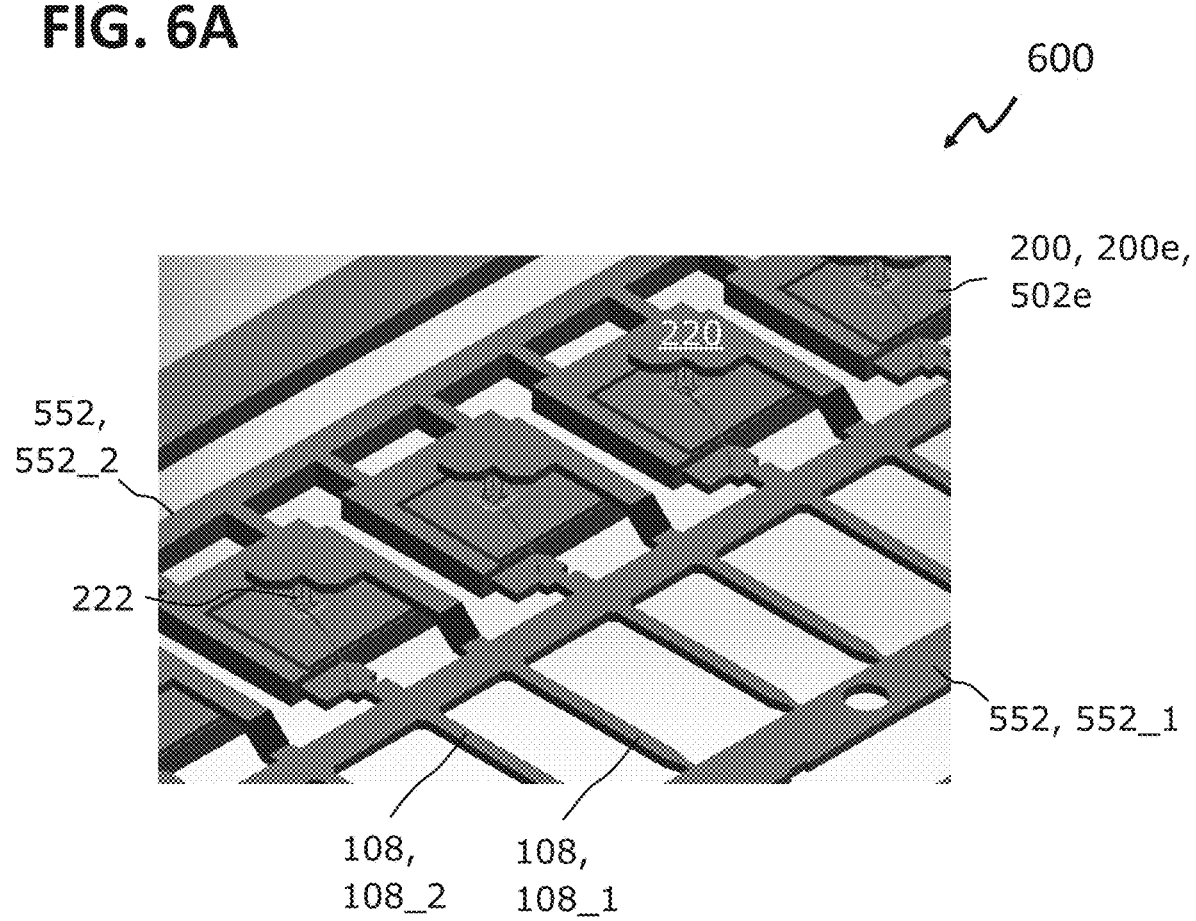
FIG. 6A shows a perspective view of a leadframe serving as a basis for a plurality of internal structures of semiconductor packages in accordance with various embodiments.

FIG. 6A visualizes a backend processing. It shows a perspective view of a structure 600 including a leadframe 552 including two single-gage leadframes 552_1, 5522 serving as a basis for a plurality of internal structures of semiconductor packages 200, 200e in accordance with various embodiments.

A thickness of the die pad leadframe 552_2 may be thicker than a thickness of the lead-/clip leadframe 552_1 (which may include the conductor element 220 and the first external contact 108_1). For example, the die pad leadframe 5522 may be about four times as thick as the lead-/clip leadframe 552_1. For example, the die pad leadframe 552_2 may have a thickness of about 2000 µm, and the lead-/clip leadframe 552_1 may have a thickness of about 500 µm.

Figure 6B:
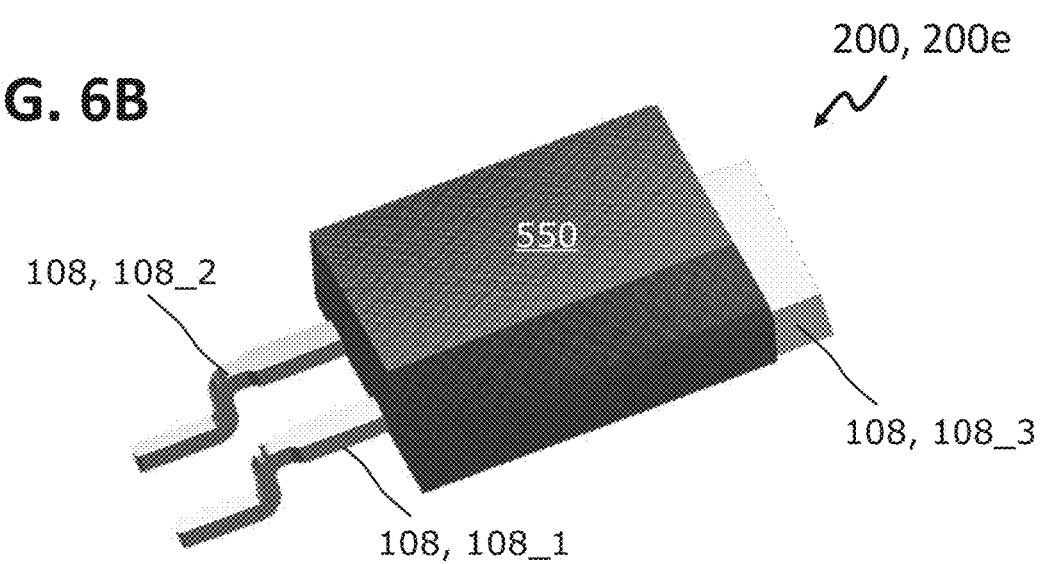
FIG. 6B shows a perspective view of a semiconductor package in accordance with various embodiments formed from one of the internal structures of FIG. 6B.

FIG. 6B shows a perspective view of a semiconductor package 200, 200e in accordance with various embodiments formed from one of the internal structures of FIG. 6A. In other words, after encapsulating the structure with an encapsulation material 550, e.g. a mold, individual chip packages 200, 200e as shown in FIG. 6B, in which only the external contacts 108 are exposed from the encapsulation material, may be formed. The package 200, 200e may be formed as a surface mount device (SMD), as a power module (PM), as an intelligent power module (IPM), as a transistor outline (TO), as a single inline package (SIP), as a dual inline package (DSO), etc.

FIG. 9 shows a flow diagram 900 of a method of forming a semiconductor package including at least one semiconductor chip having a contact pad configured to conduct a current. The method may include electrically and mechanically connecting at least one electrically conductive spacer with the contact pad using a first adhesive system (in 910), arranging a conductor element laterally overlapping the contact pad and with a distance to the contact pad (in 920), and electrically and mechanically connecting the at least one electrically conductive spacer with the conductor element, wherein the conductor element is electrically conductively connected to a clip, is at least part of a clip, is electrically conductively connected to a leadframe, or is part of a leadframe, and wherein the spacer is configured to electrically conductively connect the contact pad with the laterally overlapping portion of the conductor element (in 930).

A process flow may in various embodiments include soldering a chip on a first leadframe (which may for example be about 2 mm thick), nailhead bonding a wire (e.g. 65 µm or 75 µm diameter, ca. 1 mm length) on a contact pad (e.g. source pad) of the die, gate bonding, optional paste-printing on a second leadframe, also referred to as clip-leadframe (which may be thinner than the first leadframe, e.g. about 600 µm thick), attaching the second leadframe, which may form a clip, to the nailhead bonds (i.e., to ends of the nailhead bonds facing away from the chip), and annealing (e.g. by solder reflow of solder paste, vacuum-anneal of sinter-paste or lasering of bonds), such that the wire is connected to the second leadframe.

For the gate bonding, a wedge-bonding, e.g. as known in the art, may be used.

Various examples will be illustrated in the following:

Example 1 is a semiconductor package. The semiconductor package may include at least one semiconductor chip including a contact pad configured to conduct a current, a conductor element, wherein the conductor element is arranged laterally overlapping the contact pad and with a distance to the contact pad, at least one electrically conductive spacer, a first adhesive system configured to electrically and mechanically connect the at least one electrically conductive spacer with the contact pad, and a second adhesive system configured to electrically and mechanically connect the at least one electrically conductive spacer with the conductor element, wherein the conductor element is electrically conductively connected to a clip, is at least part of a clip, is electrically conductively connected to a leadframe, or is part of a leadframe, and wherein the spacer is configured to electrically conductively connect the contact pad with the laterally overlapping portion of the conductor element.

In Example 2, the subject-matter of Example 1 may optionally include that the at least one electrically conductive spacer includes a plurality of electrically conductive spacers.

In Example 3, the subject-matter of Example 2 may optionally include that the plurality of electrically conductive spacers includes a plurality of wires.

In Example 4, the subject-matter of Example 3 may optionally include that a thickness of each wire of the plurality of wires is in a range from 20 µm to 600 µm.

In Example 5, the subject-matter of Example 3 or 4 may optionally include that the plurality of wires is spring-loaded.

In Example 6, the subject-matter of any of Examples 1 to 5 may optionally include that the conductor element is electrically conductively connected to the clip or is at least part of the clip, and wherein the clip is exposed.

In Example 7, the subject-matter of Example 3 or 4 may optionally include that the clip is part of a dual gage leadframe and forms an additional internal heatsink.

In Example 8, the subject-matter of any of Examples 1 to 5 may optionally include that the clip is completely embedded.

In Example 9, the subject-matter of Example 2 may optionally include that the plurality of electrically conductive spacers includes a plurality of electrically conductive cylinders.

In Example 10, the subject-matter of Example 9 may optionally include that each cylinder of the plurality of electrically conductive cylinders has a diameter in a range from about 60 μm to about 350 μm.

In Example 11, the subject-matter of Example 10 may optionally include that each cylinder has a length that is a factor of 1.5 to 2.5 of its diameter.

In Example 12, the subject-matter of any of Examples 2 to 11 may optionally further include electrically insulating material, wherein the electrically insulating material is arranged to fill a space between the plurality of electrically conductive spacers.

In Example 13, the subject-matter of Example 1 may optionally include that the at least one electrically conductive spacer is a single electrically conductive block.

In Example 14, the subject-matter of any of the preceding Examples may optionally include that a distance between the contact pad and the laterally overlapping portion of the conductor element is larger than 100 μm and smaller than about 5 mm.

In Example 15, the subject-matter of any of the preceding Examples may optionally include that the first adhesive system and/or the second adhesive system includes a solder, an electrically conductive glue, a sinter material, a bonding material, a welding material, or a press contact, for example a pressfit contact.

In Example 16, the subject-matter of Example 15 may optionally include that the first adhesive system and/or the second adhesive system includes a ball bond.

In example 17, the semiconductor package according to claim 15 or 16 may optionally include that the first adhesive system and/or the second adhesive system includes a ball bond.

In Example 18, the subject-matter of Example 15 or 16 may optionally include that the second adhesive system is of the same type as the first adhesive system.

In Example 19, the subject-matter of any of the preceding Examples may optionally include that a material of the electrically conductive spacer includes or consists of at least one material of a list of electrically conductive materials, the list including copper, aluminum, gold, silver, nickel, iron, palladium, and alloys thereof.

In Example 20, the subject-matter of any of the preceding Examples may optionally include that the semiconductor chip is a power semiconductor chip.

In Example 21, the subject-matter of any of the preceding Examples may optionally include that the semiconductor chip is a diode, an insulated gate bipolar transistor, or a metal-oxide-semiconductor field-effect transistor.

In Example 22, the subject-matter of any of the preceding Examples may optionally include that the semiconductor chip includes or essentially consists of at least one semiconductor material of a group of semiconductor materials, the group including silicon carbide, silicon, and gallium nitride.

In Example 23, the subject-matter of any of the preceding Examples may optionally include that the laterally overlapping portion of the conductor element is part of a plane conductor plate that is attached to a bent portion of the conductor element forming external contacts of the semiconductor package.

In Example 24, the subject matter of any of the preceding examples may optionally include that the conductor element includes a connecting contact, wherein it is the connecting contact of the conductor element that is configured to be electrically and mechanically connected to the at least one electrically conductive spacer by the second adhesive system.

Example 25 is a method of forming a semiconductor package including at least one semiconductor chip having a contact pad configured to conduct a current. The method may include electrically and mechanically connecting at least one electrically conductive spacer with the contact pad using a first adhesive system, arranging a conductor element laterally overlapping the contact pad and with a distance to the contact pad, and electrically and mechanically connecting the at least one electrically conductive spacer with the conductor element, wherein the conductor element is electrically conductively connected to a clip, is at least part of a clip, is electrically conductively connected to a leadframe, or is part of a leadframe, and wherein the spacer is configured to electrically conductively connect the contact pad with the laterally overlapping portion of the conductor element.

In Example 26, the subject-matter of Example 25 may optionally include that the at least one electrically conductive spacer includes a plurality of electrically conductive spacers.

In Example 27, the subject-matter of Example 26 may optionally include that the plurality of electrically conductive spacers includes a plurality of wires.

In Example 28, the method according to claim 27 may optionally further include compressing the plurality of wires with a mold tool, such that the plurality of wires is spring-loaded; and encapsulating at least the plurality of wires.

In Example 29, the subject-matter of Example 27 or 28 may optionally include that a thickness of each wire of the plurality of wires is in a range from 20 μm to 600 μm.

In Example 30, the subject-matter of Example 26 may optionally include that the plurality of electrically conductive spacers includes a plurality of electrically conductive cylinders.

In Example 31, the subject-matter of Example 30 may optionally include that each cylinder of the plurality of electrically conductive cylinders has a diameter in a range from about 60 μm to about 350 μm.

In Example 32, the subject-matter of Example 31 may optionally include that each cylinder has a length that is a factor of 1.5 to 2.5 of its diameter.

In Example 33, the subject-matter of any of Examples 26 to 32 may further optionally include filling a space between the plurality of electrically conductive spacers with an electrically insulating material.

In Example 34, the subject-matter of Example 25 may optionally include that the at least one electrically conductive spacer is a single electrically conductive block.

In Example 35, the subject-matter of any of Examples 25 to 34 may optionally include that a distance between the contact pad and the laterally overlapping portion of the conductor element is larger than 100 µm and smaller than about 5 mm.

In Example 36, the subject-matter of any of Examples 25 to 35 may optionally include that the electrically and mechanically connecting at least one electrically conductive spacer with the contact pad and/or the electrically and mechanically connecting the at least one electrically conductive spacer with the conductor element includes soldering, gluing, sintering, bonding, or welding.

In Example 37, the subject-matter of Example 36 may optionally include that the electrically and mechanically connecting at least one electrically conductive spacer with the contact pad and/or the electrically and mechanically connecting the at least one electrically conductive spacer the conductor element includes ball bonding.

In Example 38, the subject-matter of any of Examples 25 to 37 may optionally include that a material of the electrically conductive spacer includes or consists of at least one material of a list of electrically conductive materials, the list including copper, aluminum gold, silver, nickel, iron, palladium.

In Example 39, the subject-matter of any of Examples 25 to 38 may optionally include that the semiconductor chip is a power semiconductor chip.

In Example 40, the subject-matter of any of Examples 25 to 39 may optionally include that the semiconductor chip is a diode, an insulated gate bipolar transistor, or a metal-oxide-semiconductor field-effect transistor.

In Example 41, the subject-matter of any of Examples 25 to 39 may optionally include that the semiconductor chip comprises or essentially consists of at least one semiconductor material of a group of semiconductor materials, the group including silicon carbide, silicon, and gallium nitride.

In Example 42, the subject-matter of any of Examples 35 to 40 may optionally include that the laterally overlapping portion of the conductor element is part of a plane conductor plate that is attached to a bent portion of the conductor element forming external contacts of the semiconductor package.

In Example 43, the subject-matter of any of Examples 20 to 36 may optionally include that the electrically and mechanically connecting the at least one electrically conductive spacer with the contact pad using a first adhesive system is performed while the semiconductor chip is still part of a semiconductor wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are therefore intended to be embraced.

What is claimed is:

1. A semiconductor package, comprising:
    at least one semiconductor chip comprising a contact pad configured to conduct a current;
    a conductor element arranged laterally overlapping the contact pad and with a distance to the contact pad;
    a plurality of electrically conductive spacers;
    a first adhesive system configured to electrically and mechanically connect the plurality of electrically conductive spacers with the contact pad; and
    a second adhesive system configured to electrically and mechanically connect the plurality of electrically conductive spacers with the conductor element,
    wherein the conductor element is electrically conductively connected to a clip or is at least part of a clip,
    wherein the plurality of electrically conductive spacers is configured to electrically conductively connect the contact pad with the laterally overlapping portion of the conductor element.

2. The semiconductor package of claim 1, wherein the plurality of electrically conductive spacers comprises a plurality of wires.

3. The semiconductor package of claim 2, wherein a diameter of each wire of the plurality of wires is in a range from 20 µm to 600 µm.

4. The semiconductor package of claim 2, wherein the plurality of wires is spring-loaded.

5. The semiconductor package of claim 1, wherein the plurality of electrically conductive spacers comprises a plurality of electrically conductive cylinders.

6. The semiconductor package of claim 5, wherein each cylinder of the plurality of electrically conductive cylinders has a diameter in a range from about 60 µm to about 350 µm.

7. The semiconductor package of claim 6, further comprising:
    electrically insulating material arranged to fill a space between the plurality of electrically conductive spacers.

8. The semiconductor package of claim 1, wherein the clip is exposed.

9. The semiconductor package of claim 1, wherein the first adhesive system and/or the second adhesive system comprises a solder, an electrically conductive glue, a sinter material, a bonding material, a welding material, or a press contact.

10. The semiconductor package of claim 9, wherein the first adhesive system and/or the second adhesive system comprises a ball bond.

11. The semiconductor package of claim 9, wherein the second adhesive system is of a same type as the first adhesive system.

12. The semiconductor package of claim 1, wherein a material of the plurality of electrically conductive spacers comprises at least one electrically conductive material selected from the group consisting of: copper; aluminum; gold; silver; nickel; iron; palladium; and alloys thereof.

13. The semiconductor package of claim 1, wherein the laterally overlapping portion of the conductor element is part of a plane conductor plate that is attached to a bent portion of the conductor element forming external contacts of the semiconductor package.

14. A method of forming a semiconductor package comprising at least one semiconductor chip having a contact pad configured to conduct a current, the method comprising;
    electrically and mechanically connecting a plurality of electrically conductive spacers with the contact pad using a first adhesive system;
    arranging a conductor element laterally overlapping the contact pad and with a distance to the contact pad; and
    electrically and mechanically connecting the plurality of electrically conductive spacers with the conductor element,
    wherein the conductor element is electrically conductively connected to a clip or is at least part of a clip,
    wherein the plurality of electrically conductive spacers is configured to electrically conductively connect the contact pad with the laterally overlapping portion of the conductor element.

15. The method of claim 14, wherein the plurality of electrically conductive spacers comprises a plurality of wires.

16. The method of claim 15, further comprising:
compressing the plurality of wires with a mold tool, such that the plurality of wires is spring-loaded; and
encapsulating at least the plurality of wires.

17. The method of claim 14, wherein the plurality of electrically conductive spacers comprises a plurality of electrically conductive cylinders.

18. The method of claim 17, wherein each cylinder of the plurality of electrically conductive cylinders has a diameter in a range from about 60 µm to about 350 µm.

19. The method of claim 14, further comprising:
filling a space between the plurality of electrically conductive spacers with an electrically insulating material.

20. The method of claim 14, wherein electrically and mechanically connecting the plurality of electrically conductive spacers with the contact pad and/or electrically and mechanically connecting the plurality of electrically conductive spacers with the conductor element comprises soldering, gluing, sintering, bonding, or welding.

21. The method of claim 20, wherein electrically and mechanically connecting the plurality of electrically conductive spacers with the contact pad and/or electrically and mechanically connecting the plurality of electrically conductive spacers with the conductor element comprises ball bonding.

22. The method of claim 14, wherein the laterally overlapping portion of the conductor element is part of a plane conductor plate that is attached to a bent portion of the conductor element forming external contacts of the semiconductor package.

23. The method of claim 14, wherein electrically and mechanically connecting the plurality of electrically conductive spacers with the contact pad using a first adhesive system is performed while the semiconductor chip is still part of a semiconductor wafer.

\* \* \* \* \*